United States Patent
Aller et al.

(10) Patent No.: US 6,909,147 B2
(45) Date of Patent: Jun. 21, 2005

(54) MULTI-HEIGHT FINFETS

(75) Inventors: Ingo Aller, Weil im Schoenbuch (DE); Joachim Keinert, Altdorf (DE); Thomas Ludwig, Sindelfingen (DE); Edward J. Nowak, Essex Junction, VT (US); BethAnn Rainey, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 10/249,738

(22) Filed: May 5, 2003

(65) Prior Publication Data

US 2004/0222477 A1 Nov. 11, 2004

(51) Int. Cl.⁷ ................. H01L 21/8238; H01L 29/78
(52) U.S. Cl. ................. 257/347; 438/199
(58) Field of Search ................. 257/208, 270, 257/315, 316, 327, 329, 347, 348, 349, 350, 618, 628; 438/151, 156, 157, 199, 212, 283, 286, 585

(56) References Cited

U.S. PATENT DOCUMENTS

| | | | | |
|---|---|---|---|---|
| 4,996,574 A | * | 2/1991 | Shirasaki | 257/66 |
| 6,252,284 B1 | | 6/2001 | Muller et al. | |
| 6,413,802 B1 | * | 7/2002 | Hu et al. | 438/151 |
| 6,562,665 B1 | * | 5/2003 | Yu | 438/149 |
| 6,645,797 B1 | * | 11/2003 | Buynoski et al. | 438/157 |
| 6,657,259 B2 | * | 12/2003 | Fried et al. | 257/350 |
| 6,706,571 B1 | * | 3/2004 | Yu et al. | 438/157 |
| 6,762,448 B1 | * | 7/2004 | Lin et al. | 257/302 |
| 2001/0036731 A1 | * | 11/2001 | Muller et al. | 438/689 |
| 2004/0099885 A1 | * | 5/2004 | Yeo et al. | 257/208 |
| 2004/0110331 A1 | * | 6/2004 | Yeo et al. | 438/199 |

OTHER PUBLICATIONS

Huang, Xuejue et al. "Sub–50nm P–Channel FinFET" May 2001. IEEE Transactions on Electron Devices, vol. 48, No. 5. pp 880–886.*
Pei, Gen et al. "FinFET Design Considerations Based on 3–D Simulation and analytical Modeling" Aug. 2002. IEEE Transactions on Electron Devices, vol. 49, No. 8., pp 1411–1419.*
Kedzierski, Jakub et al., "High–performance symmetric-–gate and CMOS–compatible Vt asymmetric–gate FinFET devices," Dec. 2001. Electron Devices Meeting, 2001, IEDM Technical Digest, pp 19.5.1–19.5.4.*

* cited by examiner

Primary Examiner—Carl Whitehead, Jr.
Assistant Examiner—Jennifer M. Dolan
(74) Attorney, Agent, or Firm—McGinn & Gibb, PLLC; Mark F. Chadurjian, Esq.

(57) ABSTRACT

The present invention provides a FinFET device that has a first fin and a second fin. Each fin has a channel region and source and drain regions that extend from the channel region. The fins have different heights. The invention has a gate conductor positioned adjacent the fins. The gate conductor runs perpendicular to the fins and crosses the channel region of each of the first fin and second fin. The fins are parallel to one another. The ratio of the height of the first fin to the height of the second fin comprises a ratio of one to 2/3. The ratio is used to tune the performance of the transistor and determines the total channel width of the transistor.

35 Claims, 6 Drawing Sheets

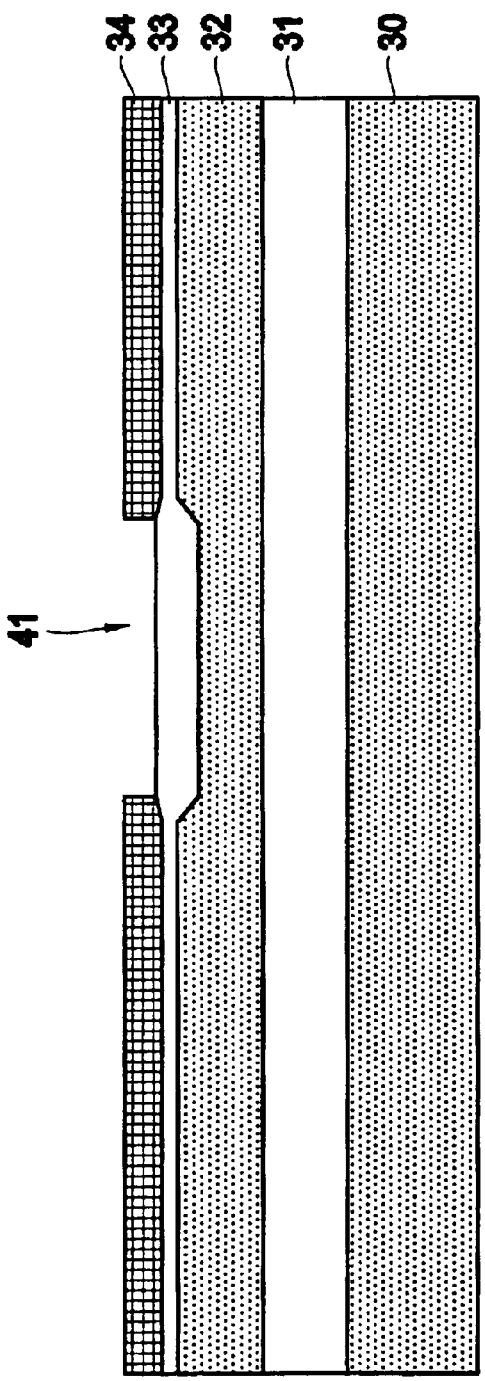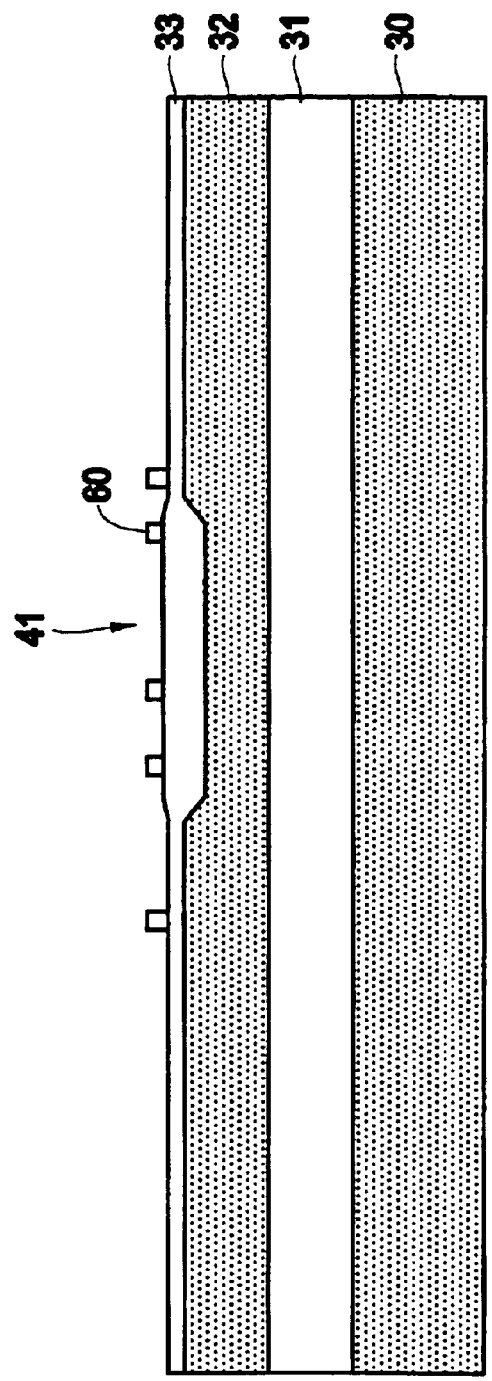

MULTI-HEIGHT FINFETS

BACKGROUND OF THE INVENTION

1. Field of the Invention

The invention relates to field effect transistors and more particularly to fin field effect transistors and to such structures that have different height fins.

2. Description of Related Art

Since 1960 when integrated circuits ("ICs") were first created and fabricated, the number and density of the devices being formed on IC substrates has tremendously. Indeed, the very large scale integration ("VLSI") devices, having more than 100,000 devices on a chip, are generally considered old technology. The fabrication of ICs having hundreds of millions of devices on a chip is standard in the market today. The development of ICs with billions of devices on each chip is under current development. Therefore, the current description of IC fabrication is ultra large scale integration ("ULSI").

As part of the increase in the number of devices formed on an IC substrate and the concurrent increase in density of the devices, the dimensions of the devices have dropped significantly. In particular, the dimensions of gate thicknesses and channel separation of source and drain elements have continually reduced such that today micrometer and nanometer separations of the source, drain, and gate are required. Although devices have been steadily reduced in size, the performance of the devices must be maintained or improved. In addition to performance characteristics, performance reliability, and durability of the device, the manufacturing reliability and cost are always critical issues.

Several problems arise with the miniaturization of devices, including short channel effects, punch-through, and current leakage. These problems affect both the performance of the device and the manufacturing process. The impact of short channel effects on device performance is seen in the reduction in the device threshold voltage and the increase of sub-threshold current.

More particularly, as the channel length becomes smaller, the source and drain depletion regions get closer to each other. The depletion regions may essentially occupy the entire channel area between the source and drain. As a result of this effective occupation of the channel area by the source and drain depletion regions, the channel is in part depleted and the gate charge necessary to alter the source and drain current flow is reduced.

One method for reducing or eliminating short channel effects is to reduce the thickness of the gate oxides adjacent to the source and drain. Not only will thin gate oxides reduce short channel effects, but they also allow for higher drive currents. One result is faster devices. As can be expected, however, there are significant problems associated with fabricating thin oxides, including manufacturing reproducibility and the uniformity and control of the oxide growth rate during the fabrication process.

To resolve the short channel effects and other problems associated with ULSI, improvements to devices have been made and are continuing. One such attempt, described in U.S. Pat. No. 6,252,284 to Muller et al. (hereinafter "Muller", which is incorporated herein by reference) discloses a field effect transistor (FET) that includes a channel region that has a fin shape and that is referred to as a FinFET device. This is shown in FIG. 1. In a FinFET type structure, the channel 24 and source and drain regions 4 are formed as a vertical silicon fin structure extending from a substrate 5. The vertical gate structure 21 intersects the channel region 24 of the fin structure. While not shown in FIG. 1, various insulator layers separate the channel region 24 from the gate 21. FIG. 1 also illustrates an oxide layer 20, and insulating sidewall spacers 12, 23 formed on the fin structure 4, 24 and the gate structure 21. The ends of the fin structure 4 receive source and drain doping implants that make these regions of the fin structure conductive. The channel region 24 of the fin structure is doped so that the silicon comprises a semiconductor, which only becomes conductive when sufficient voltage/current is present in the gate 21.

However, conventional FinFET devices are formed so that all FinFET transistors have the same fin height on a given chip. The invention described below provides a method to produce different fin heights on a single chip and a method of selecting the proper ratios between the different heights of the different fins.

SUMMARY OF THE INVENTION

The present invention provides a FinFET device that has a first fin and a second fin. Each fin has a channel region and source and drain regions that extend from the channel region. The fins have different heights. The invention has a gate conductor positioned adjacent the fins. The gate conductor runs perpendicular to the fins and crosses the channel region of each of the first fin and second fin. The fins are parallel to one another. The ratio of the height of the first fin to the height of the second fin comprises a ratio of one to 2/3. The ratio is used to tune the performance of the transistor and determines the total channel width of the transistor.

The invention also provides an integrated circuit that has a first FinFET transistor that has a first fin and a second FinFET transistor that has a second fin. Each of the fins comprises a channel region and source and drain regions that extend from the channel region. The fins have different heights. The invention also has a plurality of FinFET devices, which each have at least one fin. Each fin comprises a channel region and source and drain regions that extend from the channel region. At least two fins in the integrated circuit have different heights.

Thus, the invention provides a method of manufacturing a FinFET device. First, the invention forms an active silicon layer on a structure. Next, the invention patterns a mask above the active silicon layer. The method then performs a thermal oxidation to reduce the height of a region of the active silicon layer not protected by the mask. The method removes the mask, and patterns the active silicon layer into fins. The fins created from the shortened regions have a smaller height when compared to fins created from other regions of the active silicon layer.

The method first starts with an SOI wafer, forms an oxide on the active silicon layer and then forms a first masking layer(s) on the oxide. The wafer is then patterned to expose a region(s) of the active silicon to thermal oxidation of the active silicon not protected by the masking layers. The thermal oxidation process is controlled to reduce the height of the unmasked region to 2/3 of the height of the active silicon layer. The thermal oxidation process is used to tune the performance of the FinFET device, and determines channel widths of the FinFET device. After the oxide is formed, the first masking layer(s) are removed and a second mask layer(s) is patterned. Next, the method etches the oxide not protected by the second mask and then the mask is stripped. The process proceeds with the etching of the active silicon selective to the exposed oxide to form fins. Then, the method patterns a gate conductor over the fins such that the gate conductor crosses channel regions of the fins. Final processing is well-known in the art and will not be discussed here.

The invention also provides a method of manufacturing an integrated circuit that has FinFET devices. First, the method forms an active silicon layer on a structure. Next, the method patterns a mask above the active silicon layer. The method then performs a thermal oxidation to reduce the height of shortened regions of the active silicon layer not protected by the mask. The method the mask and patterns the active silicon layer into fins. The fins created from the shortened regions have a smaller height when compared to fins created from other regions of the active silicon layer.

Therefore, as shown above, the invention allows FinFET devices to be tuned according to a circuit designer's needs through the use of multiple fins that can have different heights. Further, the invention establishes an optimal height ratio of one to 2/3 to allow high channel width granularity without sacrificing yield and without disturbing the conventional transistor manufacturing processes.

BRIEF DESCRIPTION OF THE DRAWINGS

FIG. 5 is a schematic diagram illustrating a stage in the inventive process of manufacturing FinFET devices;

FIG. 6 is a schematic diagram illustrating a stage in the inventive process of manufacturing FinFET devices;

DETAILED DESCRIPTION OF THE PREFERRED EMBODIMENT

A class of analog-like circuits, in logic, such as sense-amplifiers, latches, and SRAM cells, are quite sensitive to transistor channel widths, and in particular, to ratios of channel widths of the different FETs contained within the devices. Therefore, the performance of different circuits within a chip can be tuned by altering the channel width of one or more of the FETs within the device. This permits the designer to alter the performance of the different logic circuits where necessary on the chip.

With FinFET structures, the channel width is proportional to the fin height because, in FinFET devices, the channel width is vertical. The channel width is actually twice the area created by the fin height (multiplied by the fin length) because both sides of the fin are exposed to, but insulated from the gate. Therefore, by increasing or decreasing the fin height (for a given fin length) the channel width (channel surface area exposed to, but insulated from the gate) is correspondingly increased or decreased. The invention provides a methodology to produce FinFETs that have different fin heights (channel widths) to allow the performance of the FinFET devices to be tuned to the designer's requirements.

Figure 1:
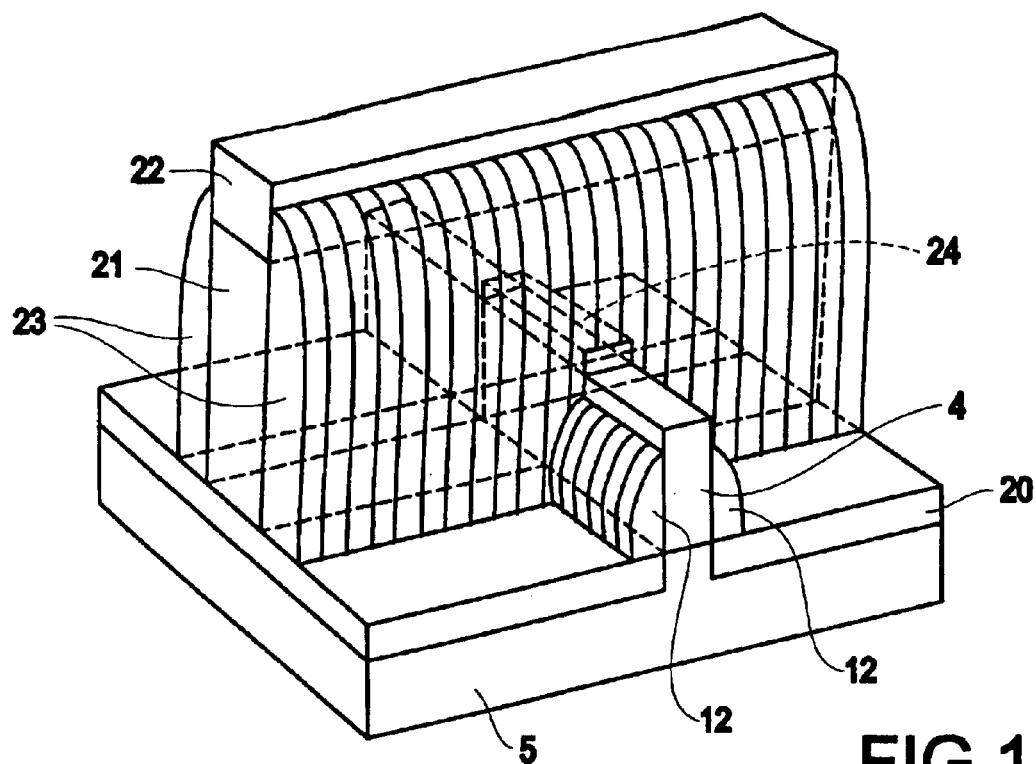
FIG. 1 is a schematic diagram of a conventional FinFET structure.
Figure 2A:
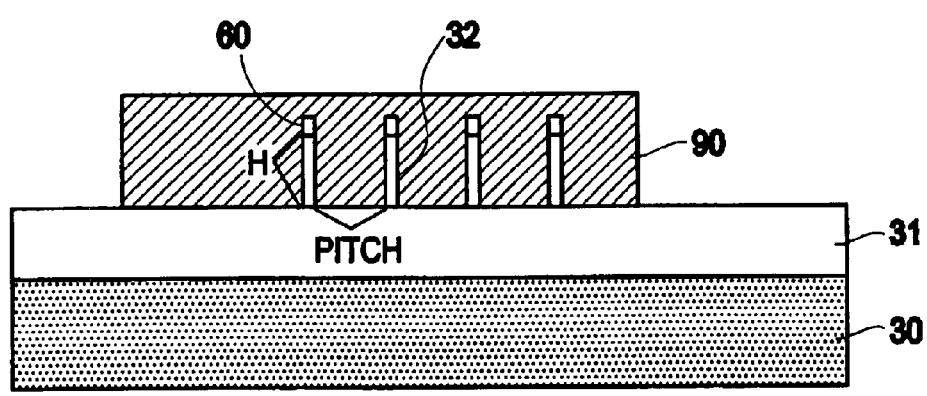
FIG. 2A is a schematic diagram of a multi-fin FinFET device in cross-section within an integrated circuit chip.
Figure 2B:
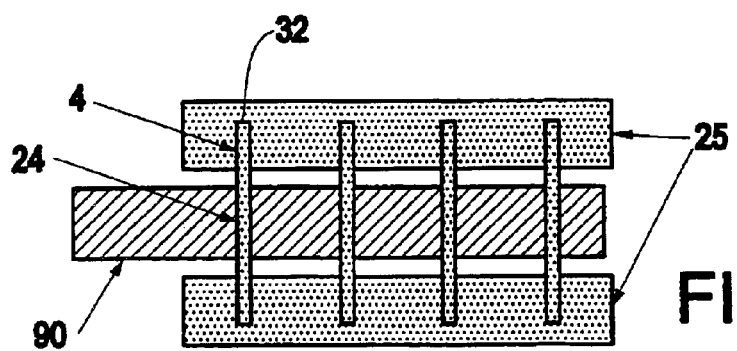
FIG. 2B it is a schematic diagram of the device shown in FIG. 2A from a top-view perspective.

FIG. 2A is a schematic diagram illustrating a cross-sectional side-view diagram of a multi-fin FinFET transistor formed within a portion of an integrated circuit chip. FIG. 2B is a schematic diagram of the same structure from a top-view perspective. The schematic diagrams illustrate a substrate 30, an oxide 31, multiple fins 32, an insulator material 60, and a gate conductor 90 formed over the fins 32 and insulator 60. As can be seen more clearly with respect to the perspective diagram in FIG. 1, the fins 32 shown in FIG. 2A extend into and out of the page and include source and drain regions 4 at their ends. As shown in FIG. 2B, the gate 90 runs perpendicular to the fins 32 and crosses the channel regions 24 of each of the fins 32.

As shown in FIG. 2A, the invention can use more than one fin per single FinFET. As shown in FIG. 2B, all the sources and drains of the different fins are electrically connected to external wiring 25 so that all of the fins 32 act together when gating the conductivity between the sources and drains. By using multiple fins, the circuit designer can increase or decrease the channel area 24 that is exposed to, but insulated from the gate. Therefore, for fins having the same length and height, two fins would double the effective channel width when compared to a single fin, three fins would triple the effective channel width, etc. Further, by providing the designer with the ability to use fins of different heights within a single transistor, the invention allows a finer granularity of channel surface area change, thereby allowing finer tuning resolution between the different circuits within a chip.

Figure 3:
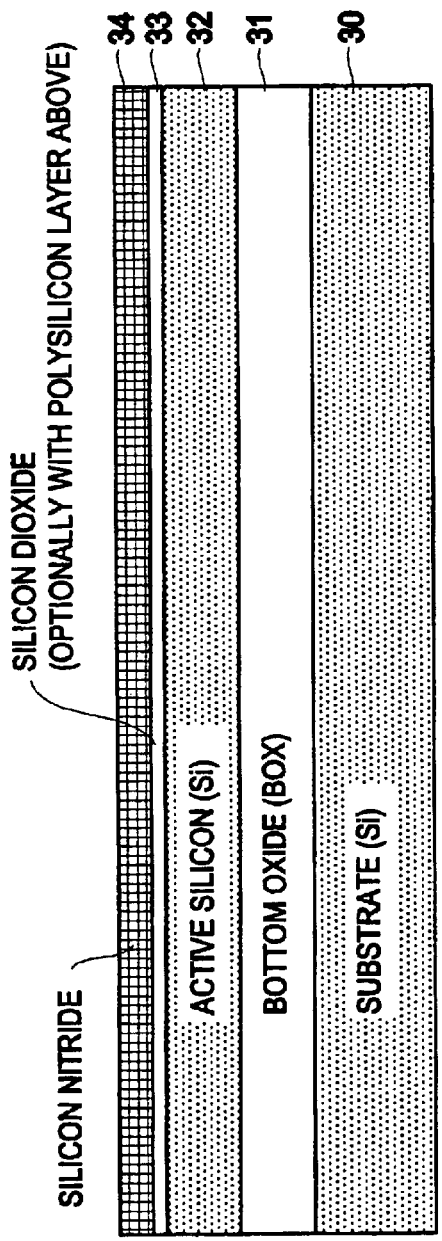
FIG. 3 is a schematic diagram illustrating a stage in the inventive process of manufacturing FinFET devices.

FIGS. 3–9 illustrate one method utilized by the invention by showing various manufacturing stages of the inventive structure. More specifically, FIG. 3 illustrates the use of an SOI wafer having an active (e.g., semiconducting) silicon layer 32 on top of a buried oxide layer 31. Item 33 represents a silicon dioxide layer in one embodiment. In another embodiment, item 33 represents a silicon dioxide with an overlying polysilicon layer. Item 34 represents a silicon nitride layer formed over the layer 33.

Figure 4:
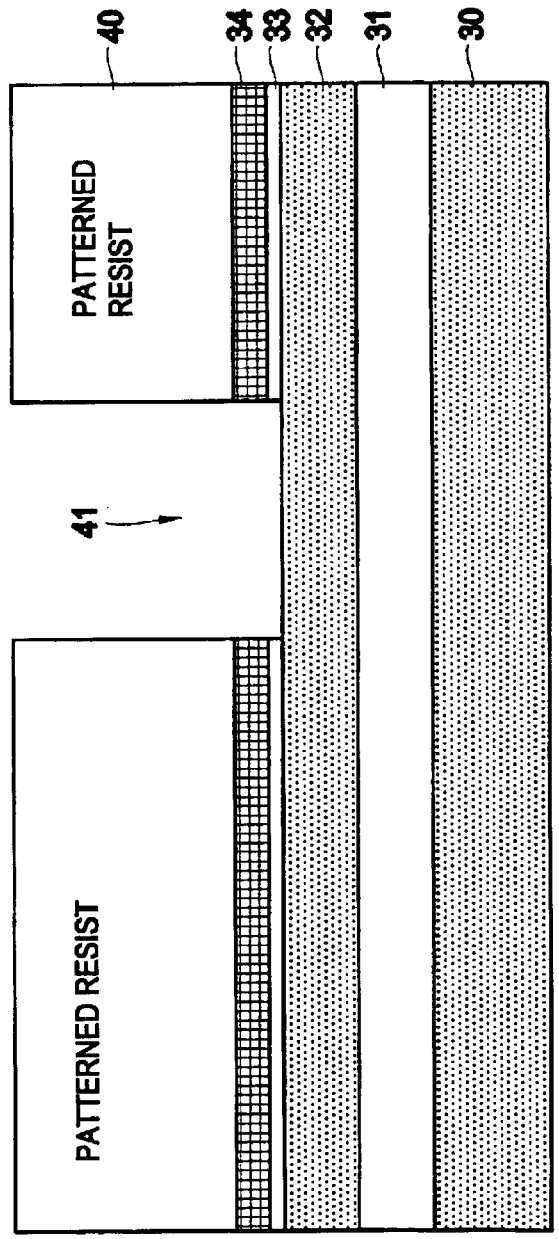
FIG. 4 is a schematic diagram illustrating a stage in the inventive process of manufacturing FinFET devices.

In FIG. 4, a photoresist 40 is formed and patterned over the silicon nitride layer 34. The structure is then etched to remove the exposed portions 41 of the structure down to the active silicon layer 32. Next, as shown in FIG. 5, the structure is subjected to a high temperature oxidation process. This oxidation process consumes a portion of the active silicon 32 that is exposed through the opening 41 in the resist. The photoresist 40 is then removed. As shown in FIG. 5, this reduces the height of the active silicon 32 in the selected region 41. While the height of the active silicon region 32 could be reduced by continuing the etching process discussed above with respect to FIG. 4, the oxidation process produces a much higher level of control over the height reduction in the exposed area 41.

Figure 7:
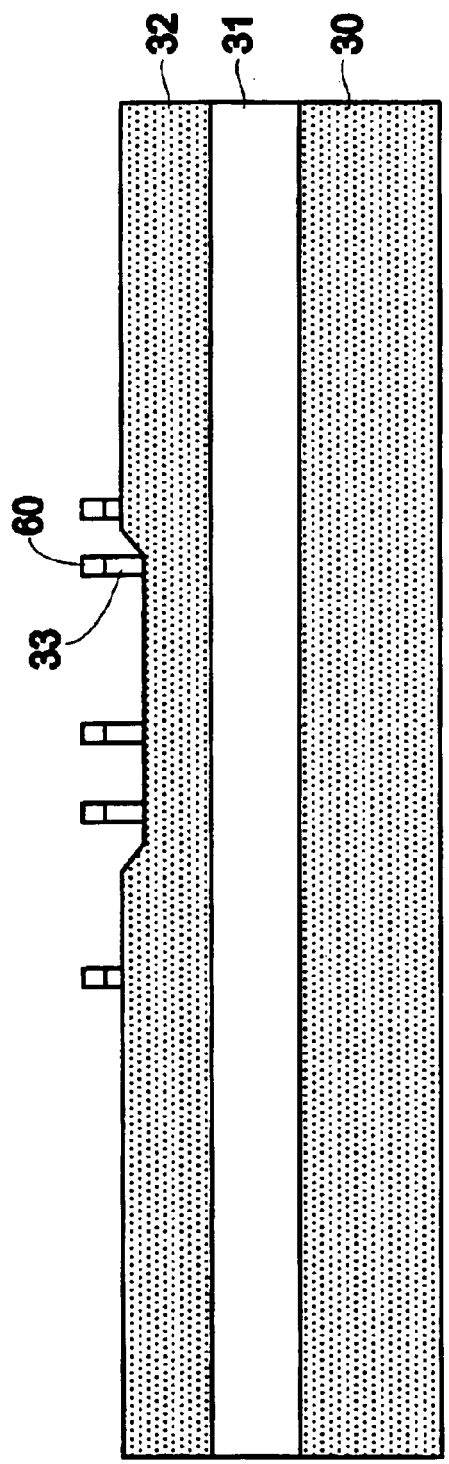
FIG. 7 is a schematic diagram illustrating a stage in the inventive process of manufacturing FinFET devices.
Figure 8:
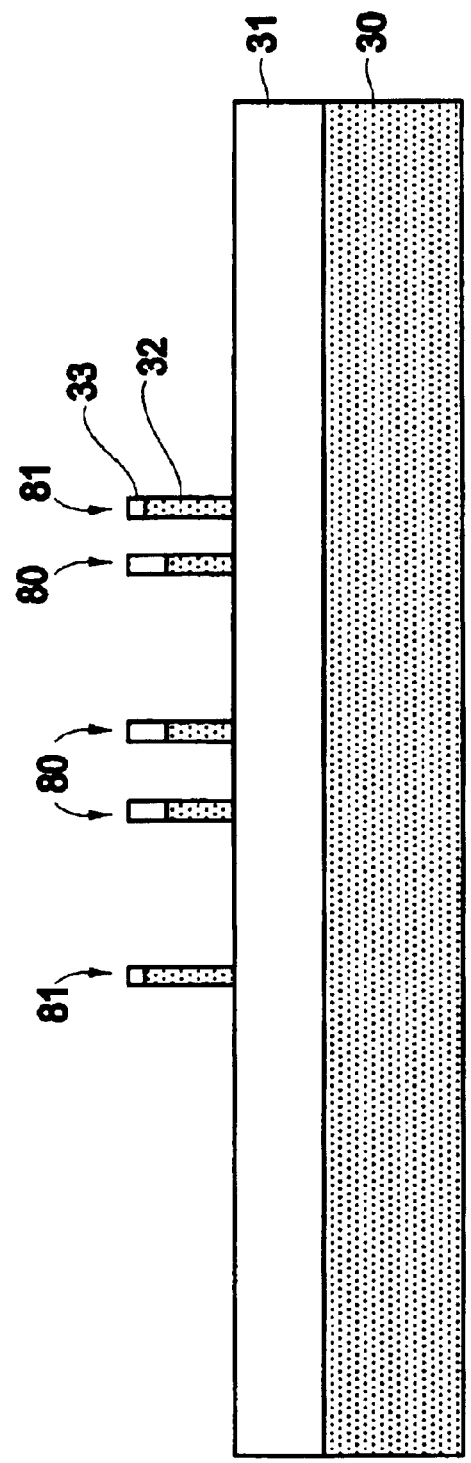
FIG. 8 is a schematic diagram illustrating a stage in the inventive process of manufacturing FinFET devices.
Figure 9:
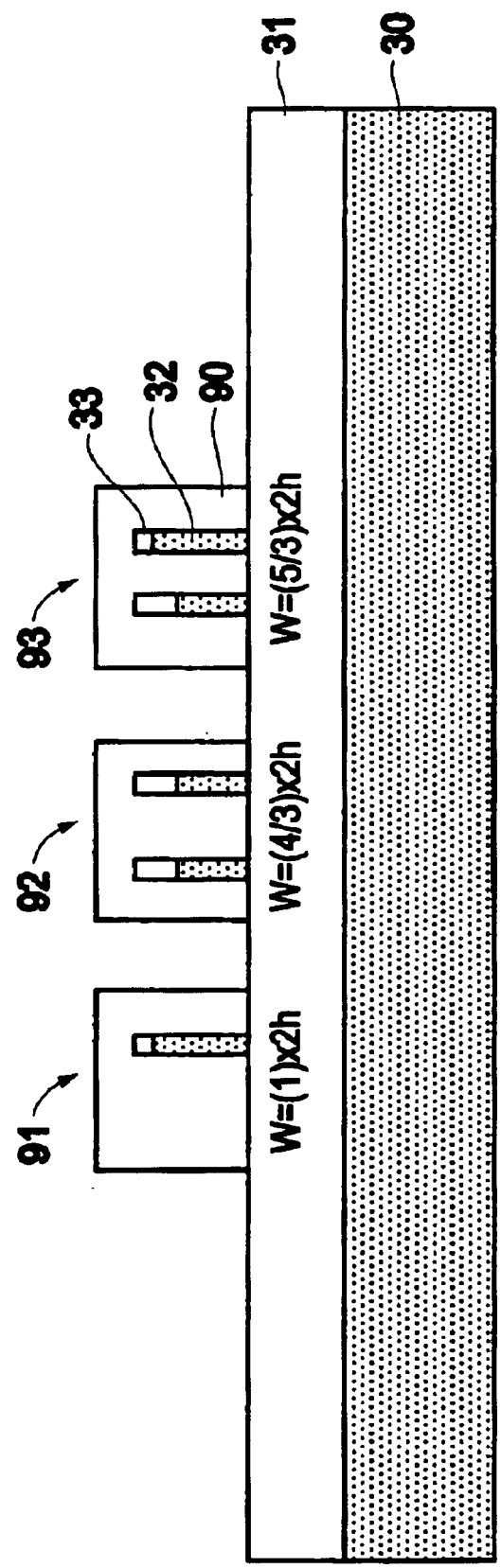
FIG. 9 is a schematic diagram illustrating a stage in the inventive process of manufacturing FinFET devices.

In FIG. 6, the nitride 34 is stripped using a selective removal process. In addition, if layer 33 included a polysilicon component, the polysilicon could also be selectively removed at this stage. A mask material 60 is then applied and patterned in locations where the fins are to be formed. In FIG. 7, the oxide is etched in a selective etching process that does not affect the underlying silicon 32. Then, as shown in FIG. 8, mask material 60 is stripped and the areas of the silicon 32 that are not protected by the oxide 33 are selectively etched with respect to the oxide 31 to form the fins 32. Fins 80 are formed in region 41 where the height of the silicon 32 was reduced in the oxidation process (discussed above with respect to FIG. 5) while fins 81 or formed in areas where the height of the active silicon 32 was not reduced. Therefore, fins 80 have a reduced height when compared to fins 81. In FIG. 9, the conductive gate material 90 is deposited and patterned. In addition, as is known in the FinFET art field, additional processing occurs to complete the transistors. For example, the regions of the fins extending beyond the gate material 4 are doped to create source and drain regions; insulator layers are formed, contacts are formed to the gate, source, and drain, etc. In this example, three transistors 91–93 are formed.

While in FIG. 2B the patterned gate conductor 90 is shown perpendicular to the fins containing channel regions 24, it may be advantageous for the gate conductor to cross the fins at an angle other than ninety degrees in order to form channels on specific crystal planes. In particular, allowing the gate to cross fins at an angle of sixty-seven and one-half degrees can allow access to both {110} and {100} planes, to yield highest mobility of holes and electrons, respectively, in silicon.

Figure 10:
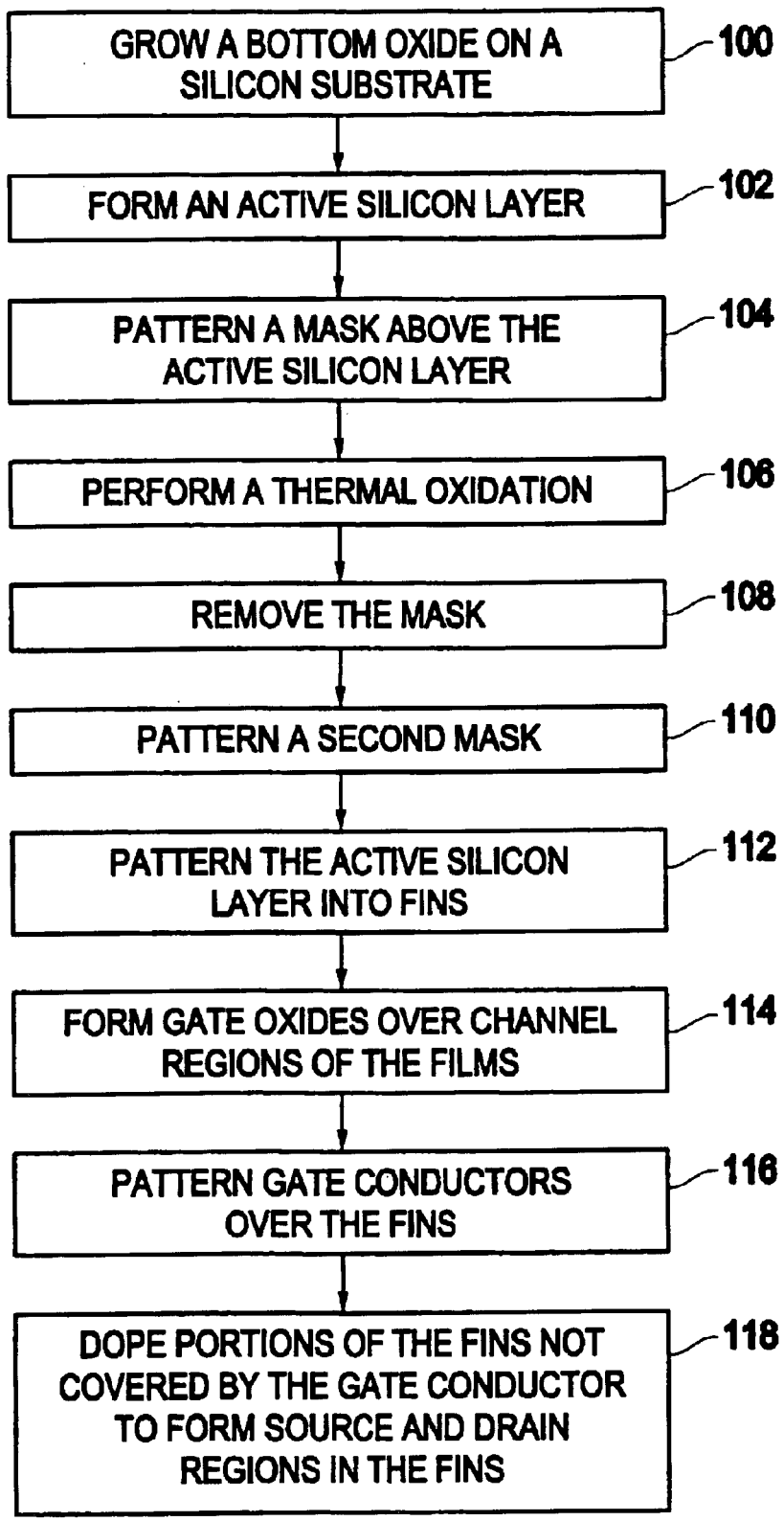
FIG. 10 is a flow diagram illustrating a preferred method of the invention.

FIG. 10 is a flow diagram which shows an embodiment of the invention. In item 100, the invention employs, but is not limited to, an SOI wafer as the starting point. Next, in item 102, the invention forms an oxide layer on the active silicon layer. Then, in item 104, the invention patterns a mask, or masking layers, above the oxide layer. In item 106, the invention performs a thermal oxidation to reduce the height of regions of the active silicon layer not protected by the mask. In item 108, the invention removes the mask, or masking layer. Next, in item 110, the invention patterns a second mask over the oxide and active silicon layer. In item 112, the invention patterns the active silicon layer into fins. The invention then forms gate oxides over channel regions of the fins in item 114. In item 116, the invention patterns gate conductors over the fins so that the gate conductors cross channel regions of the fins. Lastly, in item 118, the invention dopes portions of the fins not covered by the gate conductor to form source and drain regions in the fins.

As shown above, the invention provides individual control over the height of the fins of different FinFET devices within a given chip to allow tuning of the channel widths to achieve a certain performance goal. In addition, the invention provides the following methodology regarding the selection of different fin heights.

The forgoing description includes a single high temperature oxidation process to reduce the height of a selected portion of the active silicon that will be patterned into the fins. This process could be repeated a number of different times using different masks to create three or more different fin heights (as opposed to the two fin heights discussed above). However the invention limits the need to perform a large number of high temperature oxidation processes by utilizing the fin height ratios discussed below.

This methodology limits the fin heights (and associated channel widths) to multiples (quanta) of a base fin height to simplify processing and allow designers the broadest range of channel width choices while maintaining reasonable manufacturing process steps. The fins can be spaced at a frequency no greater than approximately the lithography scale (e.g., spaced at 70 nm for 70 nm technology) because the fins are formed lithographically (as discussed above). Taller fins would give higher current density per unit area because fewer fins would have to be utilized to achieve a desired channel width; however, this would be at the expense of larger channel width steps (coarser granularity). Smaller fins will allow finer granularity of channel widths; however, this would consume an excessive amount of chip real-estate.

In order to work around these issues, the invention establishes a standard that the smaller fins will have a height of 2/3 that of the taller fins. Through experimentation, the inventors have determined that this ratio produces optimal design solution results. This solution allows a single high temperature oxidation process to be utilized (thereby maintaining high yield). Further, by forming the heights of the fins within 1/3 of each other, the processing that forms the remaining structures in the transistors does not have to be modified. To the contrary, if some fins were made dramatically smaller than others, special processes would have to be utilized to form the contacts, source, drain, oxide, etc., for the dramatically shorter fins.

The use of the inventive one to 2/3 ratio (e.g. 1:0.667 ratio) is shown in FIG. 9. In transistor 91, the channel width is equal to one (which, as discussed above, it is actually two times the height of the fins). FIG. 9 shows this through the equation $W=(1)\times 2h$ that is shown adjacent to transistor 91. Transistor 92 has a channel width of 4/3 as shown by the equation $W=(4/3)\times 2h$. This is accomplished through use of two 2/3 height fins. As another example, transistor 93 has a channel width of 5/3 (as shown by equation $W=(5/3)\times 2h$) by combining a 2/3 height fin with a full height fin. Therefore, by utilizing full height and 2/3 height fins in multiple combinations, virtually any channel width can be achieved with the invention without substantially altering the standard transistor manufacturing processes or decreasing yield.

Therefore, as shown above, the invention allows FinFET devices to be tuned according to a circuit designer's needs through the use of multiple fins that can have different heights. Further, the invention establishes an optimal height ratio of one to 2/3 to allow high channel width granularity without sacrificing yield and without disturbing the conventional transistor manufacturing processes.

The finer granularity of channel width enabled by this invention allows those circuits whose operation is critically dependent on the relative drive strengths, or performance, of the transistors within, to occupy less physical area than would otherwise be possible. Furthermore, narrower total channel width can be achieved in these circuits, thereby resulting in lower power dissipation of the resulting circuits, when compared to conventional structures.

While the invention has been described in terms of preferred embodiments, those skilled in the art will recognize that the invention can be practiced with modification within the spirit and scope of the appended claims.

What is claimed is:

1. A FinFET device comprising:

a first fin and a second fin, each fin comprising a channel region and source and drain regions extending from said channel region, Wherein said first fin and said second fin have different heights.

2. The FinFET device in claim 1, further comprising a gate conductor positioned adjacent said first fin and said second fin, wherein said gate conductor runs perpendicular to said first fin and said second fin.

3. The FinFET device in claim 2, wherein said gate conductor crosses said channel region of each of said first fin and second fin.

4. The FinFET device in claim 1, wherein said first fin and said second fin are parallel to one another.

5. The FinFET device in claim 1, wherein a ratio of the height of said first fin to the height of said second fin comprises a ratio of one to 2/3.

6. The FinFET device in claim 5, wherein said ratio is used to tune to performance of said transistor.

7. The FinFET device in claim 5, wherein said ratio determines a total channel width of said transistor.

8. A FinFET device comprising:

a first fin and a second fin, each fin comprising a channel region and source and drain regions extending from said channel region; and a gate conductor positioned adjacent said first and said second fin, wherein said gate conductor runs at an angle of sixty-seven and one-half degrees with respect to said first fin, wherein said first fin and second fin have different heights.

9. An integrated circuit comprising:

a first FinFET transistor having a first fin; and a second FinFET transistor having a second fin, wherein each of said first fin and second fin comprise a channel region and source and drain regions extending from said channel region, and wherein said first fin and said second fin have different heights.

10. The integrated circuit in claim 9, wherein said first FinFET comprises a first gate conductor positioned adjacent to said first fin, wherein said first gate conductor runs perpendicular to said first fin, wherein said second FinFET comprises a second gate conductor positioned adjacent to said second fin, and wherein said second gate conductor runs perpendicular to said second fin.

11. The integrated circuit in claim 10, wherein said first gate conductor crosses said channel region of said first fin, and wherein said second gate conductor crosses said channel region of said second fin.

12. The integrated circuit in claim 9, wherein a ratio of the height of said first fin to the height of said second fin comprises a ratio of one to 2/3.

13. The integrated circuit in claim 12, wherein said ratio is used to tune the performance of said circuit.

14. The integrated circuit in claim 12, wherein said ratio determines channel widths of said first FinFET and said second FinFET.

15. A method of manufacturing a FinFET device comprising:

forming an active silicon layer on a structure;

patterning a mask above said active silicon layer;

performing a thermal oxidation to reduce a height of a shortened region of said active silicon layer not protected by said mask;

removing said mask; and patterning said active silicon layer into fins, wherein fins created from said shortened regions have a smaller height when compared to fins created from other regions of said active silicon layer.

16. The method in claim 15, further comprising forming said structure by growing a bottom oxide on a silicon substrate.

17. The method in claim 15, wherein said patterning of said active silicon layer comprises:

patterning a second mask over said active silicon layer; and etching regions of said active silicon layer into said fins.

18. The method in claim 15, further comprising patterning a gate conductor over said fins such that said gate conductor crosses channel regions of said fins.

19. The method in claim 15, wherein said thermal oxidation process is controlled to reduce said height of said shortened region to 2/3 of the height of said active silicon layer.

20. The method in claim 15, wherein said thermal oxidation process is used to tune the performance of said FinFET device.

21. The method in claim 15, wherein said thermal oxidation process determines a total channel widths of said FinFET device.

22. An integrated circuit comprising:

a plurality of FinFET devices, each having at least one fin, wherein each fin comprises a channel region and source and drain regions extending from said channel region, wherein at least two fins in said integrated circuit have different heights.

23. The integrated circuit in claim 22, wherein each of said FinFET transistors, further comprises a gate conductor positioned adjacent to said fin, wherein said gate conductor runs perpendicular to said fin.

24. The integrated circuit in claim 23, wherein said gate conductor crosses said channel region of said fin.

25. The integrated circuit in claim 22, wherein fins within each of said FinFET devices are parallel to one another.

26. The integrated circuit in claim 22, wherein a ratio of the height of shorter fins to taller fins comprises a ratio of one to 2/3.

27. The integrated circuit in claim 26, wherein said ratio is used to tune the performance of said integrated circuit.

28. The integrated circuit in claim 26, wherein said ratio determines a channel width of said FinFET devices.

29. A method of manufacturing an integrated circuit comprising FinFET devices, comprising:

forming an active silicon layer on a structure;

patterning a mask above said active silicon layer;

performing a thermal oxidation to reduce a height of shortened regions of said active silicon layer not protected by said mask; and removing said mask;

patterning said active silicon layer into fins, wherein fins created from said shortened regions have a smaller height when compared to fins created from other regions of said active silicon layer.

30. The method in claim 29, further comprising forming said structure by growing a bottom oxide on a silicon substrate.

31. The method in claim 29, wherein said patterning of said active silicon layer comprises:

patterning a second mask over said active silicon layer; and etching regions of said active silicon layer into said fins.

32. The method in claim 29, further comprising patterning gate conductors over said fins such that said gate conductors crosses channel regions of said fins.

33. The method in claim 29, wherein said thermal oxidation, process is controlled to reduce said height of said shortened region to 2/3 of the height of said active silicon layer.

34. The integrated circuit in claim 29, wherein said thermal oxidation process is used to tune the performance of said FinFET devices.

35. The integrated circuit in claim 29, wherein said thermal oxidation process determines channel widths of said FinFET devices.

* * * * *